United States Patent
Ruster et al.

(10) Patent No.: US 12,345,752 B2
(45) Date of Patent: Jul. 1, 2025

(54) SENSOR SYSTEM AND METHOD FOR CALIBRATING A SENSOR SYSTEM

(71) Applicants: Rohde & Schwarz GmbH & Co. KG, Munich (DE); University of Basel, Basel (CH)

(72) Inventors: Thomas Ruster, Munich (DE); Yongqi Shi, Basel (CH); Philipp Treutlein, Basel (CH); Melvyn Ho, Munich (DE)

(73) Assignees: Rohde & Schwarz GmbH & Co. KG, Munich (DE); University of Basel, Basel (CH)

( * ) Notice: Subject to any disclaimer, the term of this patent is extended or adjusted under 35 U.S.C. 154(b) by 203 days.

(21) Appl. No.: 18/341,295

(22) Filed: Jun. 26, 2023

(65) Prior Publication Data
US 2024/0426886 A1    Dec. 26, 2024

(51) Int. Cl.
*G01R 29/08*    (2006.01)
*G01R 35/00*    (2006.01)

(52) U.S. Cl.
CPC ..... *G01R 29/0878* (2013.01); *G01R 29/0892* (2013.01); *G01R 35/005* (2013.01)

(58) Field of Classification Search
CPC .......... G01R 29/0878; G01R 29/0892
See application file for complete search history.

(56) References Cited

U.S. PATENT DOCUMENTS

| 4,134,058 A | 1/1979 | Ernst |
| 11,043,939 B1 | 6/2021 | Szmuk et al. |
| 11,088,773 B1 | 8/2021 | Jiao |
| 2002/0033706 A1* | 3/2002 | Khazei ................. G01R 31/002 324/754.03 |
| 2019/0187198 A1* | 6/2019 | Anderson .......... G01R 29/0878 |
| 2022/0196716 A1* | 6/2022 | Anderson .............. G01R 29/10 |

FOREIGN PATENT DOCUMENTS

| CN | 114114094 A | 3/2022 |
| DE | 4128305 A1 | 3/1993 |
| WO | 2022/148261 A1 | 7/2022 |
| WO | 2022/229621 A1 | 11/2022 |

* cited by examiner

*Primary Examiner* — Eman A Alkafawi
*Assistant Examiner* — Suresh K Rajaputra
(74) *Attorney, Agent, or Firm* — Studebaker Brackett PLLC

(57) ABSTRACT

A sensor system for sensing EM radiation and a method for calibrating the system are provided. The system includes a sensing element that receives calibration signals or signal components with different frequencies. Recording device records responses of the sensing element to at least two calibration signals or signal components. A respective response to a calibration signal of the at least two calibration signals or signal components depends on an excitation of one or more of the resonances by the calibration signal. A part of the recorded responses to and/or information derived from at least a part of the recorded responses is stored in a model which correlates the responses to frequencies and/or signal levels of the corresponding calibration signals or signal components. Processor uses the model to convert a response of the sensing element to an EM signal to be analyzed into a frequency spectrum of the EM signal.

17 Claims, 5 Drawing Sheets

SENSOR SYSTEM AND METHOD FOR CALIBRATING A SENSOR SYSTEM

TECHNICAL FIELD

The disclosure relates to a sensor system, in particular a quantum sensor system, for sensing EM radiation. The disclosure further relates to a method for calibrating such a sensor system.

BACKGROUND ART

Quantum systems can be used to analyze spectral components of electromagnetic (EM) radiation, especially in the RF or optical range, via their energy levels. Such quantum systems can include atoms in the ground states, excited atoms (especially to Rydberg states), or atom-like systems such as NV defects in diamonds. If the EM radiation is resonant (or near-resonant) to two energy levels in the quantum system, it will interact with the quantum system and change its state. The state of the atoms can then be read out with other means (e.g., optical).

Typically, by checking the interaction with a particular pair of energy levels, only a single frequency component of the EM can be analyzed. However, it is possible to analyze multiple frequency components to perform a spectrum analysis of the EM radiation. For instance, multiple discrete frequency components can be analyzed by shifting the resonant frequency of a particular transition via external fields or by intentionally checking the interaction with multiple energy levels (or a combination of both).

However, this approach is challenging because the estimation of the frequency and/or power of EM radiation requires a precise knowledge about the external fields. For example, the magnetic field distribution within a setup should be precisely known to predict the transition frequencies of the atoms within a magnetic field.

Furthermore, the EM radiation may interact with multiple energy levels. Depending on the particular implementation of the read-out procedure, the transitions to the different energy states cannot be distinguished causing an ambiguity in the sensor output signal. If there are e.g. transitions at 3 GHZ and 4 GHz which behave similarly on state readout, the user cannot unambiguously determine the frequency of the EM radiation.

In addition, the atoms of the quantum sensor can show nonlinear behavior at high power levels of the EM radiation. Depending on the interaction type, the transitions may saturate, so the sensor response when analyzing a single frequency component does not change significantly anymore. Instead, there may be "power broadening", which means that transitions at nearby frequencies will respond as well. With power broadening, it may not be possible to distinguish a narrowband high-power signal from a broadband lower-power signal.

SUMMARY

Thus, there is a need to provide an improved sensor system and an improved method for calibrating a sensor system which enable a frequency resolved measurement of EM signals over a wide spectral range.

This is achieved by the embodiments provided in the enclosed independent claims. Advantageous implementations of the present disclosure are further defined in the dependent claims.

According to a first aspect, the present disclosure relates to a sensor system for sensing electromagnetic, EM, radiation, comprising: a sensing element having multiple resonances; wherein the sensing element is arranged to receive a number of calibration signals or signal components with different frequencies; and a recording device configured to record a response of the sensing element to at least two of the number of calibration signals or signal components, wherein the respective responses depend on an excitation of one or more of the resonances by the corresponding calibration signals or signal components. The sensor system further comprises a data storage configured to store at least a part of the recorded responses and/or information derived from at least a part of the recorded responses in a model which correlates the responses to frequencies and/or a signal levels of the corresponding calibration signals or signal components; and a processor configured to use the model to convert a further response of the sensing element to an EM signal to be analyzed into a frequency spectrum of the EM signal.

This achieves the advantage that a sensor system based on multiple different resonances, in particular a quantum sensor system, can efficiently measure the frequency spectrum of EM signals with high accuracy. Due to the calibration with multiple signals of different frequencies, an entire spectrum of an EM wave can be sensed over high spans and the ambiguity of multiple resonances can be resolved. The calibration with real world calibration signals takes into account individual sensor characteristics (e.g., exact electric/magnetic fields or other characteristics of the sensing element) and is advantageous over less accurate techniques based purely on simulations or calculations.

For example, the respective response to each calibration signal depends on whether one or more of the resonances are excited and how strongly. Multiple different resonances in the sensing element can be excited by the same calibration signal. For instance, if no resonance is excited by a calibration signal, a weak response, or no response at all is recorded.

Preferably, the calibration signals or signal components have a known signal level.

The calibration signals can be continuous wave (CW) signals.

However, a calibration signal may also have a more advanced signal forms (e.g., rectangular pulses in time domain). With such advanced signal forms, it can be possible to significantly speed up a calibration procedure, because they contain several or signal components (e.g., peaks in frequency space) which can be used for calibration.

For instance, a single calibration signals can comprise a number of calibration signal components with different frequencies, e.g. different narrow frequency peaks, which are used for calibration.

For example, the calibration signals are generated by a frequency comb.

The sensing element may comprise or may be formed by a sensing volume.

The sensing volume can comprise a gas which is stored in a gas cell. Thus, the sensing volume can comprise a spatial distribution of moving atoms. The gas can be a quantum gas. The excitation of resonances in the sensing volume may refer to the excitation of resonant transitions in the atoms of the sensing volume.

Alternatively, the sensing element may comprise a single ion or a string of ions in an ion trap, or neutral atoms in an optical lattice. In general, the sensing element may comprise a single or multiple "receiving element(s)".

The model can be a mathematical model. The model can form or can comprise calibration data for the sensor system. This calibration data can be stored in the data storage of the sensor system and can be used during each measurement of an unknown EM signal to invert the raw sensor response to spectral information about the EM signal.

The EM signal to be analyzed can be an RF or optical signal, preferably in a frequency range covered by the calibration signals or signal components.

In an implementation form, the system further comprises a magnetic and/or electric field generator configured to generate a temporally and/or spatially varying magnetic and/or electric field in the sensing element; wherein the magnetic and/or electric field generator is configured to vary the field strength of the electric and/or a magnetic field in a determined range during the recording of the respective responses to the at least two calibration signals or signal components.

For instance, the magnetic and/or electric field generator can be configured to generate a magnetic field gradient and/or different magnetic fields in the sensing element. The resonances in the sensing element can be shifted in frequency by the magnetic and/or electric field. The field generator can comprise capacitor plates on two opposing sides of the sensing element.

For example, the electric and/or magnetic field can vary in time (i.e. in the form of a sweep).

In an implementation form, the system further comprises: an RF field generator configured to generate an RF field in the sensing element; wherein a frequency and/or an intensity of the RF field changes over time and/or wherein the RF field has a spatially varying intensity distribution.

For instance, the energy levels in the sensing element can be varied and/or shifted by the RF field, e.g. a microwave field. The tuning of the resonances thereby be achieved by changing the frequency or intensity of the microwave/RF field over time, or by creating an intensity variation in space in the sensing element (e.g., a sensing volume). The RF field can be generated as RF signal.

In an implementation form, the recording device is configured to record the response of the sensing element to the at least two calibration signals or signal components as a function of the temporally and/or spatially varying electric and/or magnetic field strength.

In this way, a unique response pattern for each calibration signal (and thus for each frequency) can be stored in the model. For instance, a sensor response value is recorded for a number of predefined electric or magnetic field strengths which are applied to the sensing element.

In an implementation form, the model comprises at least one matrix or at least one look-up-table which correlate the responses of the sensing element to the frequency and/or the signal level of the corresponding calibration signals or signal components.

In an implementation form, the model is a neural network.

For example, the model is a machine learning (ML) model or a deep learning (DL) model.

The neural network can be trained on the response of the sensing element to the calibration signals or signal components. In that case, the recorded response may not directly be stored in the model, but some derived quantities from the recorded response.

In an implementation form, the processor is configured to adapt the model such that the stored response exhibits a linear relation to the signal levels of the calibration signals or signal components.

In this way, the matrix or look-up-table can define a linear relation between the sensor response and a frequency spectrum of an input signal. For instance, a 1D spectrum matrix can be formed for each calibration signal. A measurement with 1,000 calibration signals and 1,000 recorded points per calibration measurement, may result in a 1,000×1,000 matrix. The linearization can be performed by rescaling the stored response (values).

In an implementation form, to calculate the frequency spectrum of the EM signal, the processor is configured to linearize the further response of the sensing element to the EM signal and apply the thus linearized further response to the model.

For example, the model defines a calibration curve for the sensor system. Applying the linearized response to the model may refer to multiplying it with the calibration curve (or a matrix defining the calibration curve).

For instance, the linearization of the stored calibration data in the model and/or the recorded data (further response) removes non-linear effects which may result from power broadening due to high powers in the EM signal.

In an implementation form, the sensor system is a quantum sensor system.

The sensing element of the quantum sensor system can comprise several different resonances that generate multiple simultaneous responses to a single signal. The atoms in the sensing element can be in a ground state or an excited quantum state. The multiple resonances can comprise different types of resonant transitions.

For instance, the sensing element comprises Rydberg atoms. Rydberg atoms can comprise various resonances in the MHz-THz range that can be shifted by a static electric field. The sensing element can comprise Rubidium 87 atoms.

In an example, the system comprises a light source to excite the atoms in the sensing element 102 to an excited quantum state.

In case of an excitation of one of more resonances by a calibration signal, the response of the sensing element can indicate a strength of the corresponding resonant transitions in the sensing element.

In an implementation form, the system comprises a signal source configured to transmit the number of calibration signals or signal components towards the sensing element.

The signal source can comprise a signal generator which is configured to generate the calibration signals or signal components and/or an antenna which is configured to transmit the generated calibration signals or signal components.

Alternatively, the signal source can be a component of an external system (e.g., a calibration system).

According to a second aspect, the present disclosure relates to a method for calibrating a sensor system for sensing electromagnetic, EM, radiation, wherein the sensor system comprises a sensing element having multiple resonances. The method comprises the steps of: transmitting a number of calibration signals or signal components with different frequencies towards the sensing element; recording a response of the sensing element to at least two of the number of calibration signals or signal components, wherein the respective responses depend on an excitation of one or more of the resonances by the calibration signals or signal components; storing at least a part of the recorded responses and/or information derived from at least a part of the recorded responses in a model which correlates the responses to frequencies and/or signal levels of the corresponding calibration signals or signal components; wherein the model enables the sensor system to convert a further response of the sensing element to an EM signal to be analyzed into a frequency spectrum of the EM signal.

In an implementation form, the method comprises the further step of: using the model to convert the further response of the sensing element into a frequency spectrum of the EM signal.

In an implementation form, the sensor system comprises a magnetic and/or electric field generator configured to generate a temporally and/or spatially varying magnetic and/or electric field in the sensing element; wherein the method comprises the further step of: varying the field strength of the electric and/or a magnetic field in a determined range during the recording of the respective responses to the at least two calibration signals or signal components.

In an implementation form, the response of the sensing element to the at least two calibration signals or signal components is recorded as a function of the temporally and/or spatially varying electric and/or magnetic field strength.

In an implementation form, the model comprises at least one matrix or at least one look-up-table which correlate the responses of the sensing element to the frequencies and/or the signal levels of the corresponding calibration signals or signal components.

In an implementation form, the model is adapted such that the stored response exhibits a linear relation to the signal levels of the calibration signals or signal components.

In an implementation form, to calculate the frequency spectrum of the EM signal, the further response of the sensing element to the EM signal is linearized and the thus linearized further response is applied to the model.

In an implementation form, the sensor system is a quantum sensor system.

For example, in case of an excitation of one of more resonances by a calibration signal, the response of the sensing element indicates a strength of the corresponding resonant transitions in the sensing element.

The above description with regard to the sensor system according to the first aspect of the present disclosure is correspondingly valid for the method according to the second aspect of the present disclosure.

In particular, the method according to the second aspect of the present disclosure can be used to calibrate the sensor system according to the first aspect of the present disclosure.

BRIEF DESCRIPTION OF THE DRAWINGS

The above-described aspects and implementation forms of the present disclosure will be explained in the following description of specific embodiments in relation to the enclosed drawings, in which.

DETAILED DESCRIPTIONS OF EMBODIMENTS

Figure 1:
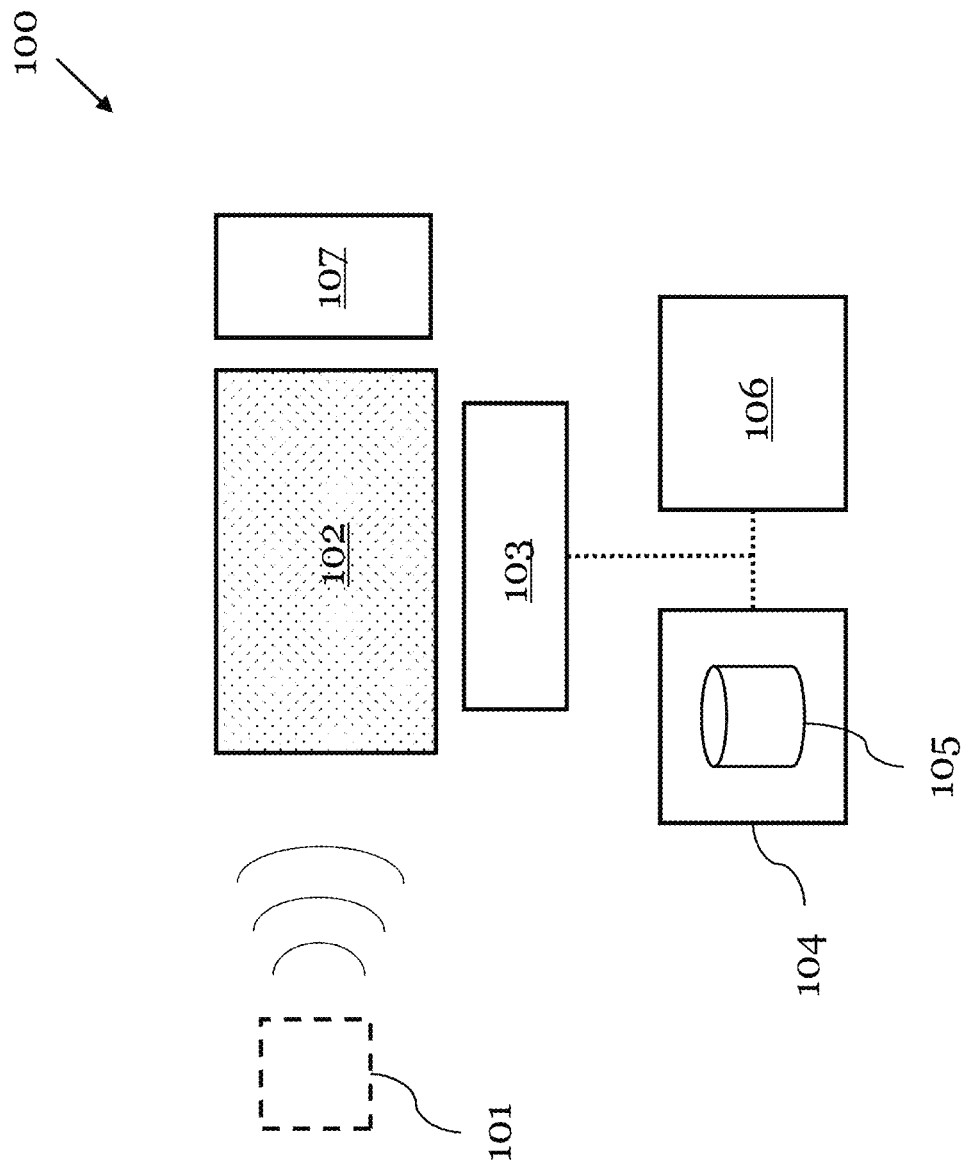
FIG. 1 shows a schematic diagram of a sensor system according to an embodiment.

FIG. 1 shows a schematic diagram of a sensor system 100 according to an embodiment.

The sensor system 100 comprises: a sensing element 102 having multiple resonances; wherein the sensing element 102 is arranged to receive a number of calibration signals or signal components with varying frequencies; a recording device 103 configured to record responses of the sensing element 102 to at least two of the number of calibration signals or signal components, wherein the respective responses depend on an excitation of one or more of the resonances by the corresponding calibration signals or signal components; a data storage 104 configured to store at least a part of the recorded responses and/or information derived from at least a part of the recorded responses in a model 105 which correlates the responses to frequencies and/or signal levels of the corresponding calibration signals or signal components; and a processor 106 configured to use the model to convert a further response of the sensing element to an EM signal to be analyzed into a frequency spectrum of the EM signal to be analyzed.

Each calibration signal can be a narrowband signal at a different frequency within a determined frequency range (e.g., a calibration range). The calibration signals can comprise radio frequency (RF) signals and/or optical signals.

In particular, the "corresponding calibration signal/signal component" of a recorded response is the calibration signal/signal component to which the response was recorded.

The recording device 103 can be configured to record a response of the sensing element 102 to each of the (number of) calibration signals, wherein the response to each calibration signal depends on an excitation of one or more of the resonances by the calibration signal.

The recording device 103 can comprise an optical recording device, such as a camera or photodiode. The response and/or the further response can be an optical and/or electrical signal. The recorded response for each calibration signal can be representative of a strength of an optical response of the sensing element 102 to the calibration signal.

The calibration signals can be CW (continuous wave) signals. Alternatively, the calibration signals may have a more advanced signal form (e.g., the calibration signals comprise rectangular pulses in time domain).

Instead of multiple calibration signals, a few or even a single calibration signal with multiple signal components can be used, wherein the signal components have different frequencies and wherein responses to these signal components are recorded.

The calibration signals can be generated by a signal source 101. This signal source 101 can be a component of the sensor system 100 or of an external system (e.g., a calibration system). For instance, the signal source 101 comprises a signal generator, such as a comb generator. The signal generator can be configured to generate the calibration signals as stepped or swept signals. The signal generator can generate the calibration signals in the form of (a few) frequency lines or series of harmonics. The signal source 101 can further comprise an antenna.

The data storage 104 can be a memory, such as a flash memory. The processor 106 can be a microprocessor or a controller.

The data storage 104 can store a respective response to each of the (recorded) calibration signals (or a part thereof) or information derived from the respective response in the model which correlates the response to the frequency and/or signal level of the corresponding calibration signal.

Preferably, the sensing element 102 is formed by or comprises a sensing volume, wherein the sensing volume comprises one or more species of atoms (e.g. in gaseous or in solid form) which exhibit the resonances.

The model 105 can comprises at least one matrix or at least one look-up-table which correlate the response of the sensing element 102 to the frequency and/or signal level of the respective calibration signals.

The model 105 can be a mathematical model. The model 105 can form or can comprise calibration data and/or can define a calibration curve for the sensor system 100. The calibration data and/or the calibration curve can be stored in the data storage of the sensor system and can be used during each measurement of an (unknown) EM signal to be analyzed to convert the raw sensor response (i.e., the further response) to a spectral information about the EM signal. For example, the raw sensor response can comprise a number of response values which are recorded with different electric and/or magnetic fields applied to the sensing element.

Alternatively, the model can be a neural network. The neural network can be trained on the response of the sensing element to the calibration signals/signal components.

The model and/or instructions for executing the model can be stored in the data storage 104. In an example, the recording device 103 and/or the processor 106 may be configured to forward at least a part of the recorded response (and/or information on the response) to the data storage to be stored/inserted in the model.

Preferably, the sensor system 100 is a quantum sensor or a quantum sensor system. In particular, the sensor system 100 is a quantum spectrum analyzer. The sensing element 102 can comprise a quantum gas in a ground state or an excited quantum state which exhibits several resonances. For instance, the sensing element 102 comprises Rubidium atoms in a gaseous form.

Preferably, the quantum sensor system 100 can analyze multiple frequency components of the EM radiation. This may either be achieved by analyzing the frequency components simultaneously, e.g. by using different energy levels of multiple atoms at the same time, by applying an electric or magnetic field gradient, by analyzing the frequency components fast enough so that the signal does not change during the measurement (e.g. by sweeping an external field, or by performing consecutive measurements on different energy levels).

The exemplary system 100 shown in FIG. 1 comprise a magnetic and/or electric field generator 107 which is configured to generate a temporally and/or spatially varying magnetic and/or electric field in the sensing element 102.

For example, the magnetic and/or electric field generator 107 is configured to vary the field strength of the electric and/or a magnetic field in the sensing element 102 in a certain range during each recording of the response to a respective calibration signal.

For example, the magnetic and/or electric field generator 107 is configured to vary the electric and/or magnetic field in time (i.e. by sweeping the electric and/or magnetic field).

The system 100 can further comprise an RF field generator instead of the M/E field generator 107 or in addition to the M/E field generator 107. The RF field generator can be configured to generate an RF field in the sensing element; wherein a frequency and/or an intensity of the RF field changes over time and/or wherein the RF field has a spatially varying intensity distribution.

Figure 2:
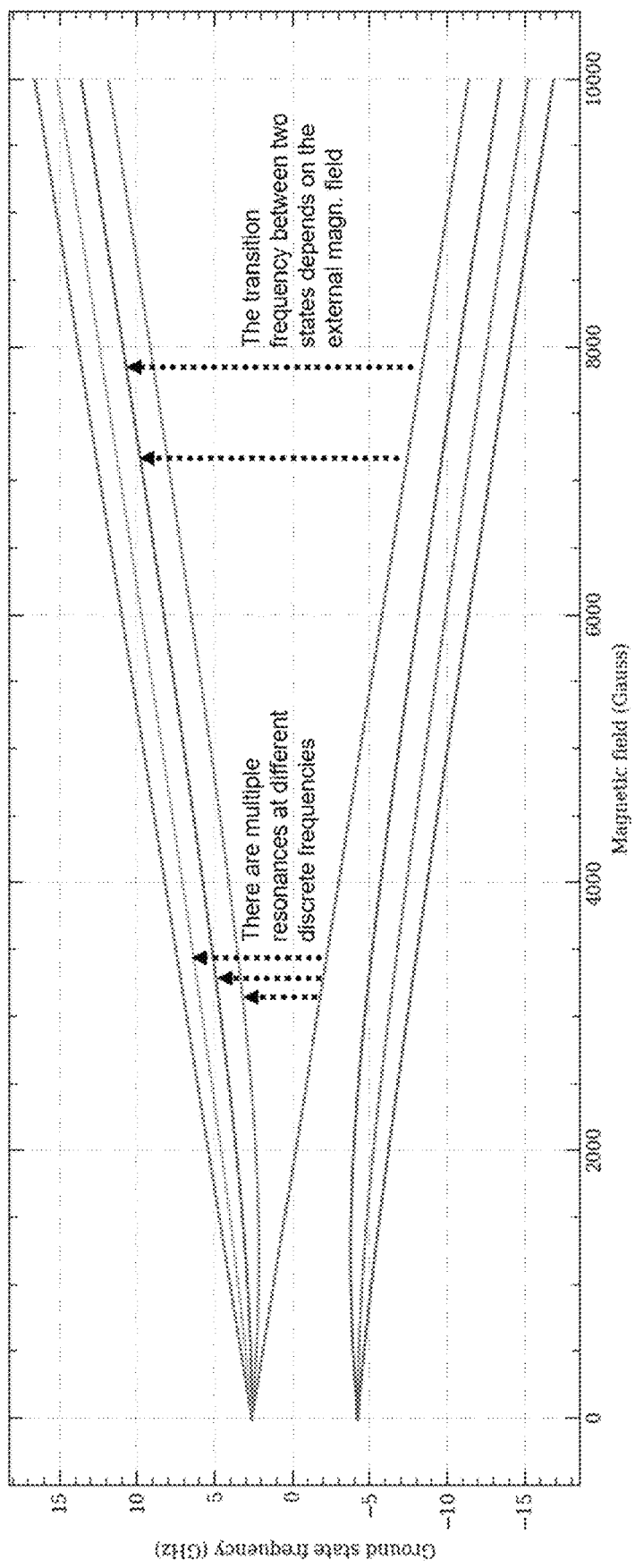
FIG. 2 shows energy levels of Rubidium 87 atoms according to an embodiment.

FIG. 2 shows ground state energy levels of Rubidium 87 atoms as a function of an applied magnetic field. As can be seen, Rubidium 87 has eight different energy levels. A resonance can be excited by an EM wave whose frequency corresponds to a transition frequency between two energy levels (as indicated by arrows in FIG. 2). The energy levels and, thus, the corresponding resonant frequencies can be shifted by changing the magnitude of the applied magnetic field.

In case of an excitation of one of more of the resonances by a calibration signal, the response of the sensing element may indicate a strength of the corresponding resonant transitions in the sensing element 102.

Due to the large number of transitions, it might not be possible to distinguish which exact transitions were responsible for a certain sensor response to a signal. For instance, if we apply a signal at 10 GHz to a sensing element 102 which comprises Rubidium 87 and thereby apply a magnetic field gradient, there are multiple magnetic field strength were the signal at this frequency may cause a transition. Typically, the detection scheme cannot distinguish the different transitions; it only checks whether there have been transitions from the ground state (bottom lines) to an excited state (top lines).

Figure 3:
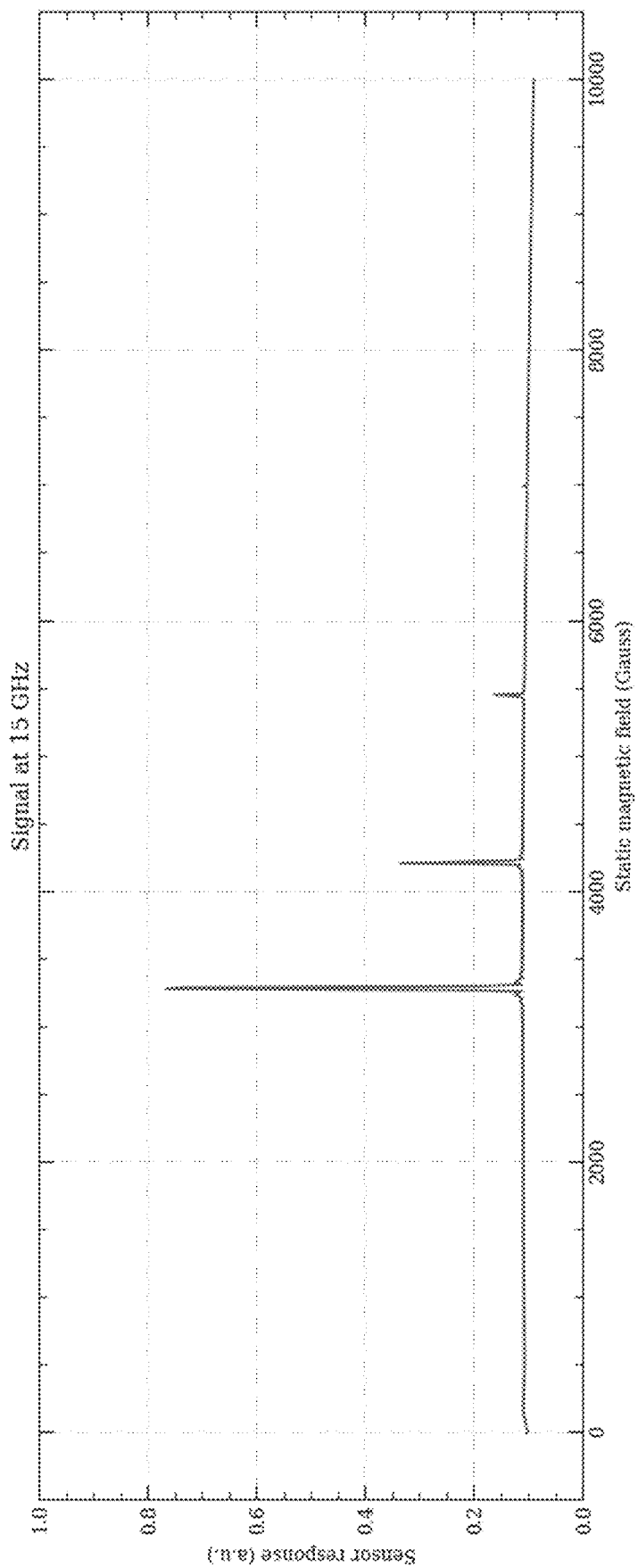
FIG. 3 shows a recorded response of a sensing element according to an embodiment.

FIG. 3 shows a recorded response of a sensing element comprising Rubidium 87 atoms to a calibration signal of known frequency according to an embodiment. The sensor response was recorded with a varying magnetic field. As can be seen, the response signal comprises three peaks caused by the multiple energy levels of the Rubidium ground state.

This measurement can be repeated with a number of calibration signals or signal components, each calibration signal/signal component having a different frequency. The response to each calibration signal has a unique signature of multiple peaks of sensor response/static field.

The recording device 103 of the sensor system 100 can be configured to record this unique response pattern as a function of the varying electric and/or magnetic field for each of the calibration signals or signal components. To calibrate the sensor device, the recording device 103 can store at least a part of this response (e.g., the sensor response "values" for a number of magnetic field values) in the model together with the frequency and/or signal power of the corresponding calibration signal or signal component.

The processor 106 can further be configured to linearize the thus generated model, e.g. by rescaling the stored response values such that they exhibit a linear relation to the input signal levels for all recorded frequencies. Thereby, non-linear effects which are, for example, caused by power broadening if the power level of an input signal exceeds a threshold value can be removed from the model.

When measuring the unknown EM signal, the processor 106 can also rescale the recorded raw sensor response (further response) and apply this rescaled (normalized) data to the model, in particular to the calibration data.

In particular, the sensor system 100 may perform a linearizing step where non-linear effects (e.g., due to power broadening at high signal levels) are removed from the sensor response and/or the model.

Furthermore, an increased sensitivity can be achieved by focusing the EM signal with antennas to a small element and taking the properties of the sensor system 100 with the before mentioned calibration into account.

Due to the calibration, the above-described quantum sensor system 100 allows for a spectrum analysis of EM signals with high frequency and power accuracy, thereby resolving ambiguity of multiple resonances.

Figure 4:
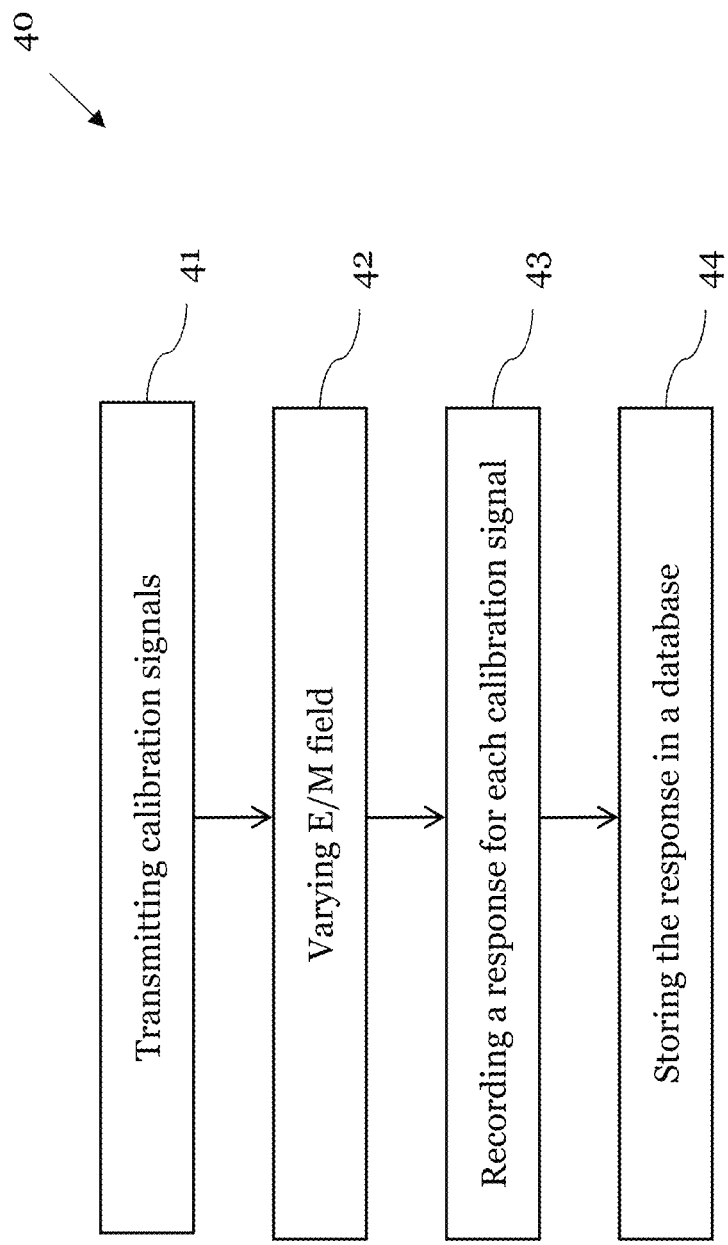
FIG. 4 shows a flow diagram of a method for calibrating a sensor system according to an embodiment.

FIG. 4 shows a flow diagram of a method 40 for calibrating a sensor system 100, as e.g. shown in FIG. 1, according to an embodiment. The sensor system 100 is preferably a quantum sensor system.

The method 40 comprises the steps of: transmitting 41 a number of calibration signals or signal components with different frequencies towards the sensing element 102 of the sensor system 100; recording 43 responses of the sensing element 102 to at least two of the number of calibration signals or signal components, wherein the respective responses depend on an excitation of one or more of the resonances by the calibration signals or signal components; and storing 44 at least a part of the recorded responses and/or information derived from at least a part of the recorded responses in the model 105 which correlates the responses to frequencies and/or signal levels of the corresponding calibration signals or signal components; wherein the model 105 enables the sensor system 100 to convert a further response of the sensing element 102 to an EM signal to be analyzed into a frequency spectrum of the EM signal.

The sensor system 100 may comprise the magnetic and/or electric field generator 107 configured to generate a temporally and/or spatially varying magnetic and/or electric field in the sensing element. As shown in FIG. 4, the method 40 can further comprise the further step of: varying 42 the field strength of the electric and/or a magnetic field in a determined range during each recording of the response to a calibration signal or signal component.

The response of the sensing element to each of the calibration signals or signal components can be recorded 43 as a function of the varying electric and/or magnetic field strength.

In case of an excitation of one of more resonances by a calibration signal or signal component, the response of the sensing element 102 indicates a strength of the corresponding resonant transitions in the sensing element.

The model may comprise at least one matrix or at least one look-up-table which correlate the response of the sensing element to the calibration signal frequency.

In a further step of the method 40, the model (or the data stored in the model) can be adapted such that the stored response exhibits a linear relation to the signal levels of the calibration signals or signal components. Furthermore, to calculate the frequency spectrum of the EM signal, also the further response of the sensor element to the EM signal can be linearized and applied to the model. In this way, non-linear effects due to power broadening at higher input signal levels can be mitigated.

The thus determined frequency spectrum of the EM signal can be an RF spectrum, i.e., the EM input signal in the frequency domain.

Figure 5:
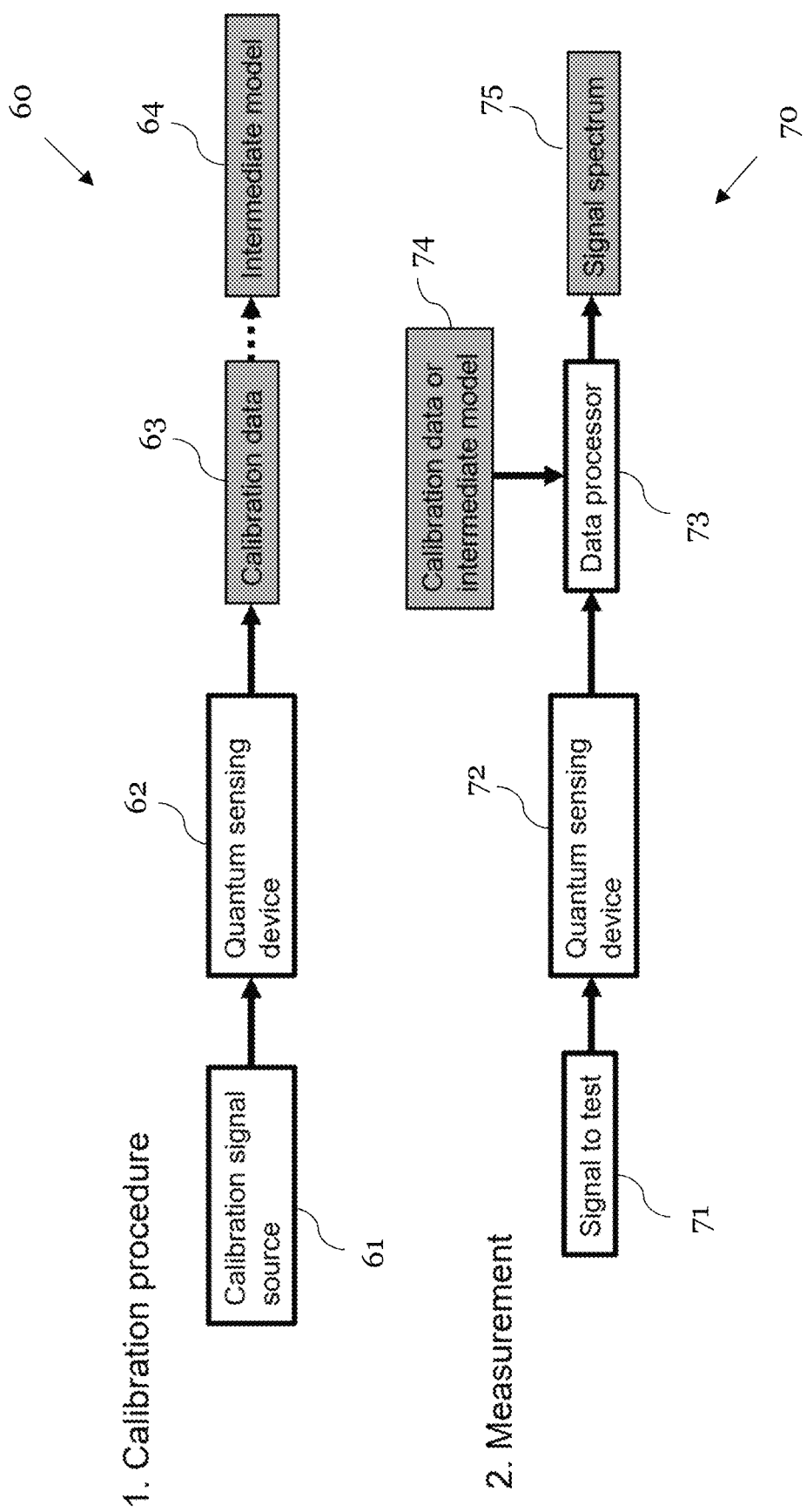
FIG. 5 shows flow diagrams of calibration and measurement procedures according to an embodiment.

FIG. 5 shows flow diagrams of a calibration procedure 60 and a measurement procedure 70 for the quantum sensor system 100 according to an embodiment.

The calibration procedure 60 can be essentially equivalent to the method 40 shown in FIG. 4 and can be used to calibrate a quantum sensor system 100 comprising a sensing element 102 with, e.g., Rubidium atoms.

The calibration procedure 60 can comprise the following sequence:

1) Firstly, a calibration signal source generates signals 61, e.g. CW signals, whose signal frequency is changed in small steps. These signals are forwarded 62 to the sensing element 102 of the quantum sensor system 100 and a spectrum (signal response vs magnetic field strength as, e.g., shown in FIG. 3) is measured for each signal frequency. Thereby, it can be assumed that the power is small enough that saturation and/or power broadening does not play a role. In this way, calibration data can be recorded.

2) In a next step, the measured calibration data 63 can be rescaled, so that the sensor response is linear with respect to the input powers of the (CW) signals. This can be either done by theoretical calculations or with the aid of additional calibration data (measured sensor responses for different CW signal powers). The preferably rescaled calibration data 63 can be fed to an intermediate model 64 which correlates the sensor response to the input signal frequency.

3) In the linear regime for small signal powers, the sensor response is typically a linear transformation on the spectrum of the input data. Therefore, the calibration data can be expressed by a 2D matrix, where the first dimension is given by the static magnetic field, and the second dimension is given by the input signal frequency.

For example, this calibration sequence 60 can be run in a factory before delivering the sensor system 100 to a customer, and/or on site by a customer or service technician.

The calibration procedure 60 can be applied to any given further sensor response to an EM signal to be analyzed, e.g., by first rescaling the measured data (similar to step 2 in the calibration sequence 60) and solving the linear equation "sensor_response=calibration_matrix*input_spectrum" for input_spectrum. The solution can reconstruct the input spectrum of the EM signal to be analyzed and resolve any ambiguity due to the multiple resonances of the atoms in the quantum sensor.

A possibility to speed up the calibration sequence 60 is to not measure a spectrum for a large number of frequencies of the calibration signals, but to only measure a few frequencies and interpolate the results between them. By applying a frequency comb, this could even be done in a single measurement.

For large signal powers, the sensor response at resonance can saturate, and the line(s) in the sensor response caused by the resonant transmission can broaden, i.e., nearby frequencies can respond as well. This effect can be compensated for in step 2) of the calibration procedure above either by theoretical calculations or by calibration data at high signal powers.

Due to power broadening, it may not always be possible to distinguish a narrowband high-power signal from a broadband lower-power signal. It is possible to resolve this ambiguity by measuring different field amplitudes of the same EM radiation. In this case, it is possible to include the additional measurements in the calibration routine 60.

The measurement procedure 70, which can be carried out after calibration, can comprise: detecting a test signal 71 (i.e., a signal to be analyzed) with the quantum sensor system 72, processing the sensor response in the processor 73 by comparing it to the calibration data and/or the intermediate model 74 and calculating a signal spectrum 75 of the test signal 71 based on said comparison.

Prior to the calibration procedure 70, a pre-calibration with theoretical calculations and/or simulations can be carried out. For instance, depending on the particular atom species in the sensing element 102, the frequency and the strength of the transitions can be accurately simulated and/or calculated by solving the Schrödinger equation for those atoms. So, in principle, the response of the atoms can be accurately predicted. This information can be used to infer information about an unknown EM signal to be analyzed from the sensor response.

However, to infer this information from calculations/simulations alone, precise knowledge about the electric and/or magnetic fields in the sensor setup must be known. For example, the magnetic field distribution within the sensing element 102 must be precisely known to predict the transition frequencies of the atoms within a magnetic field.

In order to enhance the strength of the electromagnetic radiation (i.e. to improve the sensitivity of the sensor system 100), the quantum sensor 100 can be placed in an antenna or resonator that focusses the incoming EM radiation to a small element. However, to calculate the strength of the initial EM radiation, the field distribution created by the antenna/resonator should be known in this case. In this way, an RF spectrum analyzer that measures the frequency spectrum of an RF signal contained in a cable/waveguide (instead of measuring a free-space electromagnetic field) can be realized. For instance, in order to access the signal with the atoms, the signal can be converted to a known electric or magnetic field distribution via an antenna, and/or the atoms can be brought close to the field of the waveguide.

Furthermore, the field distributions of the static electric and/or magnetic field and the RF signal may be subject to thermal drifts, aging, and/or fabrication uncertainties which is difficult to consider with theoretical calculations or simulations. To take these uncertainties into account, the above calibration methods and routines 40, 60 allow calibrating the quantum sensor 100 by means of a well-known reference signal.

All features described above or features shown in the figures can be combined with each other in any advantageous manner within the scope of the disclosure.

The invention claimed is:

1. A sensor system for sensing electromagnetic, EM, radiation, comprising:
   a sensing element having multiple resonances;
   wherein the sensing element is arranged to receive a number of calibration signals or signal components with different frequencies;
   a recording device configured to record responses of the sensing element to at least two of the number of calibration signals or signal components, wherein the respective responses depend on an excitation of one or more of the resonances by the corresponding calibration signals or signal components;
   a data storage configured to store at least a part of the recorded responses and/or information derived from at least a part of the recorded responses in a model which correlates the responses to frequencies and/or signal levels of the corresponding calibration signals or signal components; and
   a processor configured to use the model to convert a further response of the sensing element to an EM signal to be analyzed into a frequency spectrum of the EM signal.

2. The system of claim 1, further comprising:
   a magnetic and/or electric field generator configured to generate a temporally and/or spatially varying magnetic and/or electric field in the sensing element;
   wherein the magnetic and/or electric field generator is configured to vary the field strength of the electric and/or magnetic field in a determined range during the recording of the respective responses to the at least two calibration signals or signal components.

3. The system of claim 2,
   wherein the recording device is configured to record the responses of the sensing element to the at least two calibration signals or signal components as a function of the temporally and/or spatially varying electric and/or magnetic field strength.

4. The system of claim 1, further comprising:
   an RF field generator configured to generate an RF field in the sensing element;
   wherein a frequency and/or an intensity of the RF field changes over time and/or wherein the RF field has a spatially varying intensity distribution.

5. The system of claim 1,
   wherein the model comprises at least one matrix or at least one look-up-table which correlate the responses of the sensing element to the frequencies and/or the signal levels of the corresponding calibration signals or signal components.

6. The system of claim 1,
   wherein the model is a neural network.

7. The system of claim 1,
   wherein the processor is configured to adapt the model such that the stored response exhibits a linear relation to the signal levels of the calibration signals or signal components.

8. The system of claim 1,
   wherein, to calculate the frequency spectrum of the EM signal, the processor is configured to linearize the further response of the sensing element and apply the thus linearized further response to the model.

9. The system of claim 1,
   wherein the sensor system is a quantum sensor system.

10. The system of claim 1, further comprising:
    a signal source configured to transmit the number of calibration signals or signal components towards the sensing element.

11. A method for calibrating a sensor system for sensing electromagnetic, EM, radiation, wherein the sensor system comprises a sensing element having multiple resonances, the method comprising the steps of:
    transmitting a number of calibration signals or signal components with different frequencies towards the sensing element;
    recording responses of the sensing element to at least two of the number of calibration signals or signal components, wherein the respective responses depend on an excitation of one or more of the resonances by the corresponding calibration signals or signal components; and
    storing at least a part of the recorded responses and/or information derived from at least a part of the recorded responses in a model which correlates the responses to frequencies and/or signal levels of the corresponding calibration signals or signal components;
    wherein the model enables the sensor system to convert a further response of the sensing element to an EM signal to be analyzed into a frequency spectrum of the EM signal.

12. The method of claim 11,
    wherein the sensor system comprises a magnetic and/or electric field generator configured to generate a temporally and/or spatially varying magnetic and/or electric field in the sensing element; and wherein the method comprises the further step of:
    varying the field strength of the electric and/or a magnetic field in a determined range during the recording of the respective responses to the at least two calibration signals or signal components.

13. The method of claim 12,
    wherein the responses of the sensing element to the at least two calibration signals or signal components are recorded as a function of the temporally and/or spatially varying electric and/or magnetic field strength.

14. The method of claim 11,
    wherein the model comprises at least one matrix or at least one look-up-table which correlate the response of the sensing element to the frequencies and/or the signal levels of the corresponding calibration signals or signal components.

15. The method of claim 11,
wherein the model is adapted such that the stored response exhibits a linear relation to the signal levels of the calibration signals or signal components.

16. The method of claim 11,
wherein, to calculate the frequency spectrum of the EM signal, the further response of the sensing element to the EM signal is linearized and the thus linearized further response is applied to the model.

17. The method of claim 11,
wherein the sensor system is a quantum sensor system.

* * * * *